(12) United States Patent
Shibata (10) Patent No.: US 7,941,573 B2
(45) Date of Patent: May 10, 2011

(54) SEMICONDUCTOR MEMORY DEVICE

(75) Inventor: Tomoyuki Shibata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 373 days.

(21) Appl. No.: 12/146,121

(22) Filed: Jun. 25, 2008

(65) Prior Publication Data

US 2009/0006687 A1 Jan. 1, 2009

(30) Foreign Application Priority Data

Jun. 27, 2007 (JP) ................................. 2007-169015

(51) Int. Cl.
*G06F 13/28* (2006.01)
*G06F 13/38* (2006.01)

(52) U.S. Cl. ....... 710/23; 710/71; 365/189.05; 711/100; 711/154

(58) Field of Classification Search ......................... None
See application file for complete search history.

(56) References Cited

U.S. PATENT DOCUMENTS

| | | | |
|---|---|---|---|
| 5,532,940 A * | 7/1996 | Agarwal et al. | 709/204 |
| 6,324,224 B1 * | 11/2001 | Ikeda | 375/341 |
| 6,999,352 B2 * | 2/2006 | Yoshida et al. | 365/189.05 |
| 7,405,981 B2 * | 7/2008 | Dietrich | 365/189.05 |
| 7,667,629 B2 * | 2/2010 | Pothireddy et al. | 341/98 |
| 2003/0091056 A1 * | 5/2003 | Walker et al. | 370/419 |
| 2004/0012583 A1 * | 1/2004 | Teshirogi et al. | 345/204 |
| 2005/0138518 A1 * | 6/2005 | Cideciyan et al. | 714/752 |
| 2006/0049851 A1 * | 3/2006 | Park et al. | 326/112 |
| 2008/0240462 A1 * | 10/2008 | Pennock | 381/86 |
| 2010/0257429 A1 * | 10/2010 | Noguchi | 714/763 |

FOREIGN PATENT DOCUMENTS

| | | |
|---|---|---|
| JP | 5-334206 A | 12/1993 |
| JP | 2004-133961 A | 4/2004 |

* cited by examiner

*Primary Examiner* — Henry W Tsai
*Assistant Examiner* — Michael Sun
(74) *Attorney, Agent, or Firm* — Sughrue Mion, PLLC (57) ABSTRACT

Data transfer bus charging/discharging current is reduced in a semiconductor memory device. In a data transfer device that sequentially transfers bit sequences in parallel through a plurality of buses from a transmit unit 10 to a receive unit 20, the transmit circuit 10 includes a flag generation circuit 11 and an encoding circuit 12. The flag generation circuit 11 generates a flag indicating whether bit inversion has occurred in consecutive bits in each of the bit sequences to be transferred through the buses and transmits the generated flag to the receive unit 20. The encoding circuit 12 encodes the bit sequences based on the flag, for transmission to the receive unit 20. The receive unit includes a decoding circuit 21 that decodes the bit sequences based on the bit sequences and the flag.

14 Claims, 9 Drawing Sheets

|  | t1 | t2 | t3 | t4 |
|---|---|---|---|---|
| RWBS_R | O(A2) | | O(A0) | | O(A2) |
| RWBS_F | O(A3) | | O(A1) | | O(A3) |
| RWBS_I | O(F) | | 1(F) | | O(F) |

FIG. 4

|        | t1      | t2     | t3     | t4     |
|--------|---------|--------|--------|--------|
| RWBS_R | 0(A$_2$) | 0(A$_0$) |        | 1(A$_2$) |
| RWBS_F | 1(A$_3$) | 1(A$_1$) |        | 1(A$_3$) |
| RWBS_I | 0(F)    | 1(F)   |        | 1(F)   |

|        | t1     | t2 | t3     | t4 |
|--------|--------|----|--------|----|
| RWBS0  | 0(A$_0$) | | 1(A$_0$) | |
| RWBS1  | 0(A$_1$) | | 1(A$_1$) | |
| RWBS2  | 0(A$_2$) | | 1(A$_2$) | |
| RWBS3  | 0(A$_3$) | | 1(A$_3$) | |

|  | t1 | t2 | t3 | t4 |
|---|---|---|---|---|
| RWBS_R | 0(A2) | | 1(A0) | 0(A2) |
| RWBS_F | 0(A3) | | 1(A1) | 0(A3) |

FIG. 8

|         | t1      | t2      | t3    | t4      |
|---------|---------|---------|-------|---------|
| RWBS_R  | 0 (A$_2$) | 1 (A$_0$) |       | 0 (A$_2$) |
| RWBS_F  | 1 (A$_3$) | 0 (A$_1$) |       | 0 (A$_3$) |

SEMICONDUCTOR MEMORY DEVICE

REFERENCE TO RELATED APPLICATION

This application is based upon and claims the benefit of the priority of Japanese patent application No. 2007-169015, filed on Jun. 27, 2007, the disclosure of which is incorporated herein in its entirety by reference thereto.

TECHNICAL FIELD

The present invention relates to a semiconductor memory device. More specifically, the invention relates to a semiconductor memory device including a data transfer device with lower power consumption.

BACKGROUND

With multi-bit prefetching and an increase in a word configuration (such as x16, x32, or the like), a proportion of RWBS (Read/Write Bus) charging/discharging current occupied in an operating current of semiconductor memory devices has increased.

Accordingly, in order to reduce the operating current of a semiconductor memory device such as a DDR2 SDRAM based on a 4-bit prefetch or a DDR3 SDRAM based on an 8-bit prefetch, it is effective to reduce the RWBS charging/discharging current.

Figure 6A:
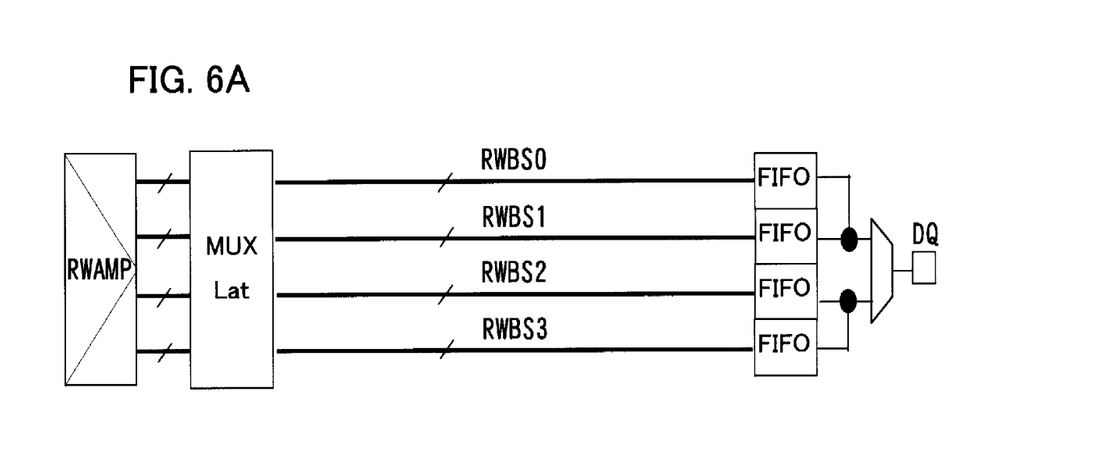
FIGS. 6A and 6B are respectively a block diagram of a conventional data transfer device (that uses a 4-bit parallel transfer method) and a polarity diagram of bus signals.
Figure 6B:
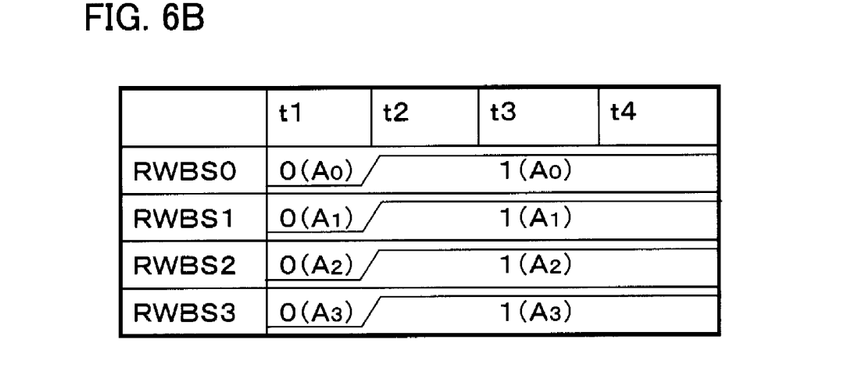

FIGS. 6A and 6B respectively show a block diagram of the DDR2 SDRAM based on a 4-bit parallel transfer method and a polarity diagram of bus signals per one DQ. A period corresponding to the one DQ is indicated by t1 to t4 in FIG. 6B.

Figure 7A:
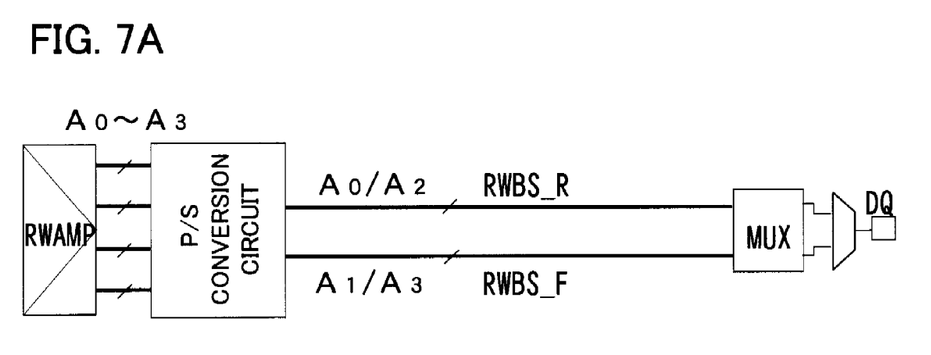
FIGS. 7A and 7B are respectively a block diagram of a conventional data transfer device (based on a time division transfer method using a 4:2 P/S conversion) and a polarity diagram of bus signals.
Figure 7B:
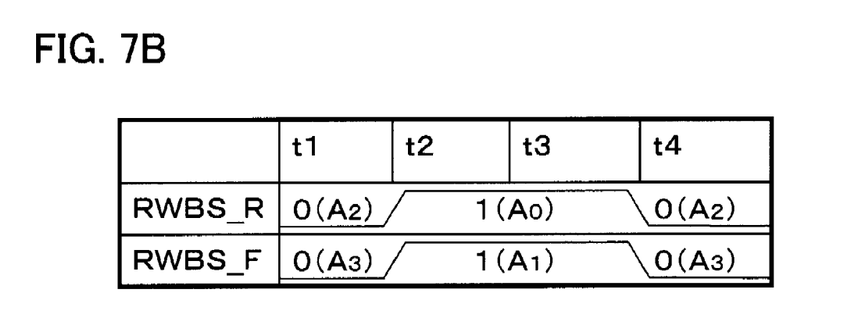

FIGS. 7A and 7B respectively show a block diagram of the DDR2 SDRAM based on a time division transfer method using a 4:2 P/S (Parallel/Serial, parallel-to-serial) conversion and a polarity diagram of bus signals per one DQ.

Referring to FIGS. 6A and 7A, it can be seen that the number of RWBSs has been reduced to two in the latter method, from four in the former method.

Patent Document 1 discloses a bus signal polarity determination circuit that reduces SSO (Simultaneous Switching Output) noise and system current consumption, which are not addressed by a conventional art. Patent Document 2 discloses a DDR SDRAM including a data inversion function.

Patent Document 1

JP Patent Kokai Publication No. JP-A-5-334206

Patent Document 2

JP Patent Kokai Publication No. JP-P2004-133961A

SUMMARY OF THE DISCLOSURE

The entire disclosures of Patent Documents 1 and 2 are incorporated herein by reference thereto. The following analysis was made by the inventor of the present invention.

The number of times of transients per DQ in the four-bit parallel transfer method, or the number of polarity changes of the buses is four in a worst data pattern shown in FIG. 6B.

On the other hand, the number of times of transients per DQ in the time division transfer method using the 4:2 P/S conversion is four in a worst data pattern shown in FIG. 7B.

That is, when the four-bit parallel transfer method is changed into the time division transfer method using the 4:2 P/S conversion, the number of the buses is reduced, but the RWBS charging/discharging current is not necessarily reduced.

When the techniques disclosed in Patent Documents 1 and 2 are applied to a use for reducing the RWBS charging/discharging current of a DDR SDRAM, a large-scale majority decision circuit and the like are needed. Thus, there is a problem that due to these circuits, the operating current will be increased, the circuit size (area) will be increased, and the operating speed will be reduced.

Accordingly, it is a challenge to reduce RWBS charging/discharging current in a semiconductor memory device while avoiding an increase in the operating current of the semiconductor memory device, an increase in the circuit size of the semiconductor memory device, and reduction of the operating speed of the semiconductor memory device.

According to a first aspect of the present invention, there is provided a data transfer unit sequentially transfers bit sequences in parallel from a transmit unit to a receive unit through a plurality of buses. The transmit unit includes: a flag generation circuit which generates a flag indicating whether or not bit inversion has occurred in consecutive bits in each of the bit sequences to be transferred through the buses, and transmits the generated flag to the receive unit.

An encoding circuit encodes the bit sequences based on the flag, for transmission to the receive unit. The receive unit includes a decoding circuit that decodes the bit sequences based on the bit sequences and the flag.

According to a first development mode, a data transfer device may sequentially transfer the bit sequences in parallel from the transmit unit to the receive unit through two buses, based on a 4:2 parallel-to-serial conversion.

In a data transfer device in a second development mode, the flag generation circuit may be so configured as to generate a flag being valid, only when the bit inversion has occurred in the consecutive bits of the bit sequences to be transferred through the two buses, respectively, and to transmit the valid flag to the receive unit. The encoding circuit may be so configured as to invert the bit sequences only when the flag is valid and to transmit the inverted bit sequences to the receive unit. The decoding circuit may be so configured as to invert the bit sequences only when the flag is valid.

In a data transfer device in a third development mode, the flag generation circuit may be so configured as to generate a valid flag only: in case where a flag generated by the flag generation circuit followed by transmission to the receive unit is received, or a flag generated by the flag generation circuit is stored, and consecutive bits to be transferred through the two buses, respectively, are both inverted and the flag is not valid, or in case where the bit inversion does not occur in at least one of the consecutive bits to be transferred through the two buses, respectively, and the flag is valid. Then the generated valid flag is transmitted to the receive unit.

According to a second aspect of the present invention, there is provided a data transfer device configured to repeat a process of transmitting a first bit ($A_0$) through a first bus, a second bit ($A_1$) through a second bus, a third bit ($A_2$) through the first bus, and a fourth bit $A_3$ through the second bus, from a transmit unit to a receive unit. The data transfer device further includes: a third bus configured to transfer an inversion flag F. The transmit unit further includes: a flag generation circuit; and an encoding circuit. The receive unit further includes: a decoding circuit.

The flag generation circuit receives the first through fourth bits ($A_0$ to $A_3$) and the inversion flag (F), and is so configured as to output to the third bus the inversion flag (F) as a valid flag, (i) when bit inversion between the first bit ($A_0$) and the third bit ($A_2$) and bit inversion between the second bit ($A_1$) and the fourth bit ($A_3$) occur and the inversion flag (F) is not valid, and (or) (ii) when at least one of the bit inversion between the first bit ($A_0$) and the third bit ($A_2$) and the bit inversion between the second bit ($A_1$) and the fourth bit ($A_3$) does not occur and the inversion flag (F) is valid; and otherwise to output to the third bus the inversion flag (F) as an invalid flag.

The encoding circuit receives the first through fourth bits ($A_0$ to $A_3$) and the inversion flag (F), and is so configured as to invert the first through fourth bits ($A_0$ to $A_3$) when the inversion flag (F) is valid, and otherwise to output the first through fourth bits ($A_0$ to $A_3$) to the first and second bus without alteration.

The decoding circuit receives the first through fourth bits ($A_0$ to $A_3$) and the inversion flag (F), and is so configured as to invert the first through fourth bits ($A_0$ to $A_3$) when the inversion flag (F) is valid, and otherwise to output the first through fourth bits ($A_0$ to $A_3$) without alteration.

Preferably, the encoding circuit in the data transfer device in a fourth development mode includes: an XOR circuit that receives the first bit ($A_0$) or the third bit ($A_2$) and the inversion flag (F), for output to the first bus; and an XOR circuit that receives the second bit or the fourth bit and the inversion flag F, for output to the second bus.

Preferably, the decoding circuit in the data transfer device in a fifth development mode includes: an XOR circuit that receives the first bit ($A_0$) or the third bit ($A_2$) and the inversion flag (F); and an XOR circuit that receives the second bit ($A_1$) or the fourth bit ($A_3$) and the inversion flag (F).

Preferably, the flag generation circuit in the data transfer device in a six development mode includes: a first XOR circuit that receives the first bit ($A_0$) and the third bit ($A_2$); a second XOR circuit that receives the second bit ($A_1$) and the fourth bit ($A_3$); an AND circuit that receives outputs of the first and second XOR circuits; and a third XOR circuit that receives an output of the AND circuit and the inversion flag F, for output to the third bus.

A multi-stage data transfer device in a seventh development mode may include: the data transfer devices, as first, second, and third data transfer devices. The multi-stage data transfer device may be so configured as to supply outputs of the first and second data transfer devices to the third data transfer device.

Preferably, a semiconductor memory device in an eighth development mode includes: the data transfer device described above.

According to a third aspect of the present invention, there is provided a data transfer method of sequentially transferring bit sequences in parallel from a transmit unit to a receive unit through a plurality of buses. The method includes: generating a flag indicating whether bit inversion has occurred in consecutive bits in each of the bit sequences to be transferred through the buses, and transmitting the generated flag to the receive unit (termed as a flag generation process);

encoding the bit sequences based on the flag, for transmission to the receive unit (termed as an encoding process); and decoding the bit sequences based on the bit sequences and the flag (termed as a decoding process).

The data transfer method in a ninth development mode may be a data transfer method of sequentially transferring the bit sequences in parallel from the transmit unit to the receive unit through two buses, based on a 4:2 parallel-to-serial conversion.

In the data transfer method in a tenth development,

In the flag generation process, a valid flag may be generated only when the bit inversion has occurred in the consecutive bits of each of the bit sequences to be transferred through the different buses, respectively, and the valid flag may be transmitted to the receive unit. In the encoding process, the bit sequences may be inverted only when the flag is valid and the inverted bit sequences may be transmitted to the receive unit. In the decoding process, the bit sequences may be inverted only when the flag is valid.

In the data transfer method in an eleventh development mode, in the flag generation flag process, a valid flag may be generated a valid flag may be generated and transmitted to the receive unit only: in case where the flag generated in the flag generation process followed by transmission to the receive unit is received or a flag generated in the flag generation process is stored, and the consecutive bits to be transferred through the two buses, respectively, are both inverted and the flag is not valid; or in case where the bit inversion does not occur in at least one of the consecutive bits to be transferred through the two buses, respectively, and the flag is valid.

The meritorious effects of the present invention are summarized as follows.

Compared with a conventional semiconductor memory device, the semiconductor memory device of the present invention can reduce RWBS charging/discharging current while suppressing an increase of the operating current of the semiconductor memory device, an increase in the circuit size of the semiconductor memory device, and reduction of the operating speed of the semiconductor memory device.

PREFERRED MODES OF THE INVENTION

A data transfer device according to an exemplary embodiment of the present invention will be described in detail with reference to drawings.

Figure 1:
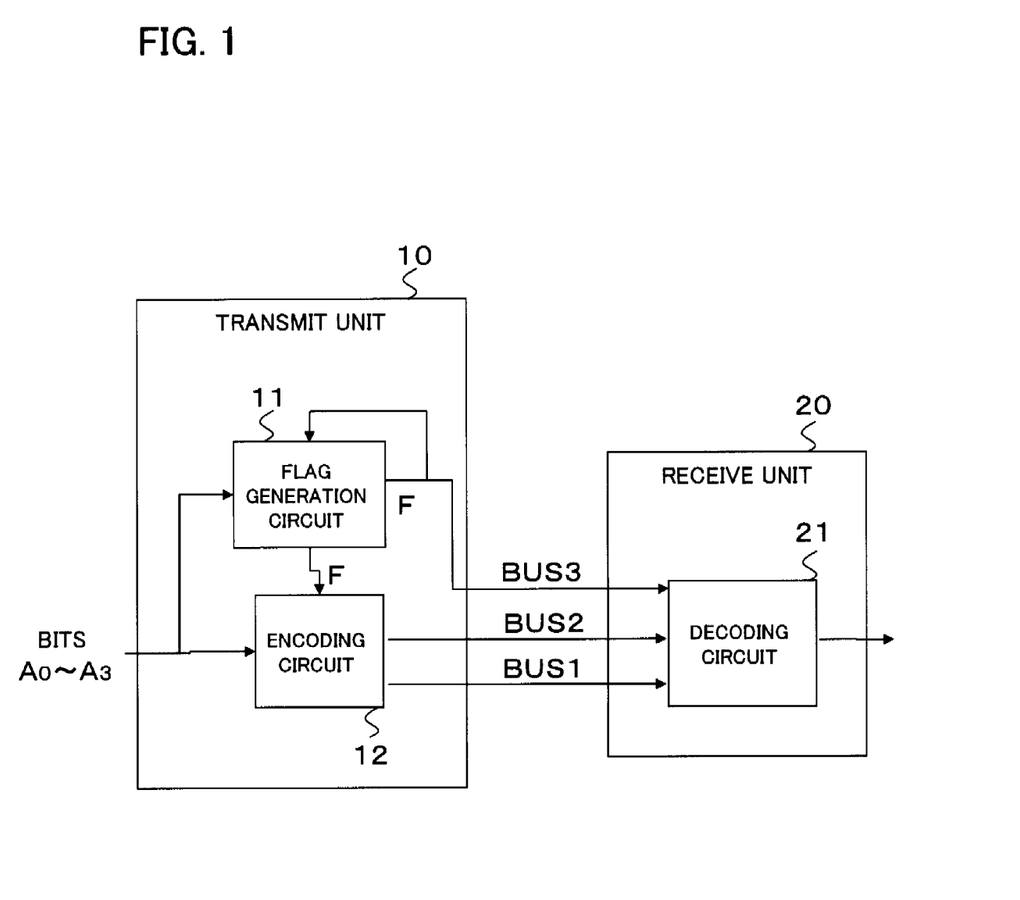
FIG. 1 is a block diagram of a data transfer device according to an exemplary embodiment of the present invention.

Referring to FIG. 1, a data transfer device according to a exemplary embodiment of the present invention is a data transfer device that sequentially transfers bit sequences from a transmit unit 10 to a receive unit 20 in parallel through a plurality of buses.

The transmit (transmission) unit 10 includes a flag generation circuit 11 that generates a flag indicating whether or not bit inversion has occurred in consecutive bits in each of the bit sequences to be transferred through the buses, and transmits the generated flag to the receive unit 20, and an encoding circuit 12 that encodes the bit sequences based on the flag and transmits the encoded bit sequences to the receive unit (receiving unit) 20.

The receive unit 20 includes a decoding circuit 21 that decodes the bit sequences based on the bit sequences and the flag.

A description will be directed to a case where the data transfer device according to the exemplary embodiment of the present invention has been applied to time division transfer using a 4:2 parallel-to-serial conversion, in further detail, with reference to FIG. 1.

The data transfer device is so configured as to repeat a step of transmitting from the transmit unit 10 to the receive unit 20 a first bit $A_0$ through a first bus BUS1, a second bit $A_1$ through a second bus BUS2, a third bit $A_2$ through the first bus BUS1, and a fourth bit $A_3$ through the second bus BUS2.

The data transfer device further includes a third bus BUS3 configured to transfer an inversion flag F.

The flag generation circuit 11 receives the first through fourth bits $A_0$ to $A_3$ and the inversion flag F. The flag generation circuit 11 outputs the inversion flag F to the third bus BUS3 as a valid flag—(i) in a case where bit inversion has occurred between the first bit $A_0$ and the third bit $A_2$, bit inversion has occurred between the second bit $A_1$ and the fourth bit $A_3$, and the inversion flag F is not valid; and—(ii) in a case where at least one of the bit inversion between the first bit $A_0$ and the third bit $A_2$ and the bit inversion between the second bit $A_1$ and the fourth bit $A_3$ has not occurred and the inversion flag F is valid. Otherwise, the flag generation circuit 11 outputs the inversion flag F to the third bus BUS3 as an invalid flag.

The encoding circuit 12 receives the first through fourth bits $A_0$ to $A_3$ and the inversion flag F. When the inversion flag F is valid, the encoding circuit 12 inverts the first through fourth bits $A_0$ to $A_3$. Otherwise, the encoding circuit 12 outputs the first through fourth bits $A_0$ to $A_3$ to the first bus BUS1 and the second bus BUS2 as they be (without alteration).

The decoding circuit 21 receives the first through fourth bits $A_0$ to $A_3$ and the inversion flag F. When the inversion flag F is valid, the decoding circuit 21 inverts the first through fourth bits $A_0$ to $A_3$. Otherwise, the decoding circuit 21 outputs the first through fourth bits $A_0$ to $A_3$ as they be (without alteration).

First Exemplary Embodiment

Figure 2:
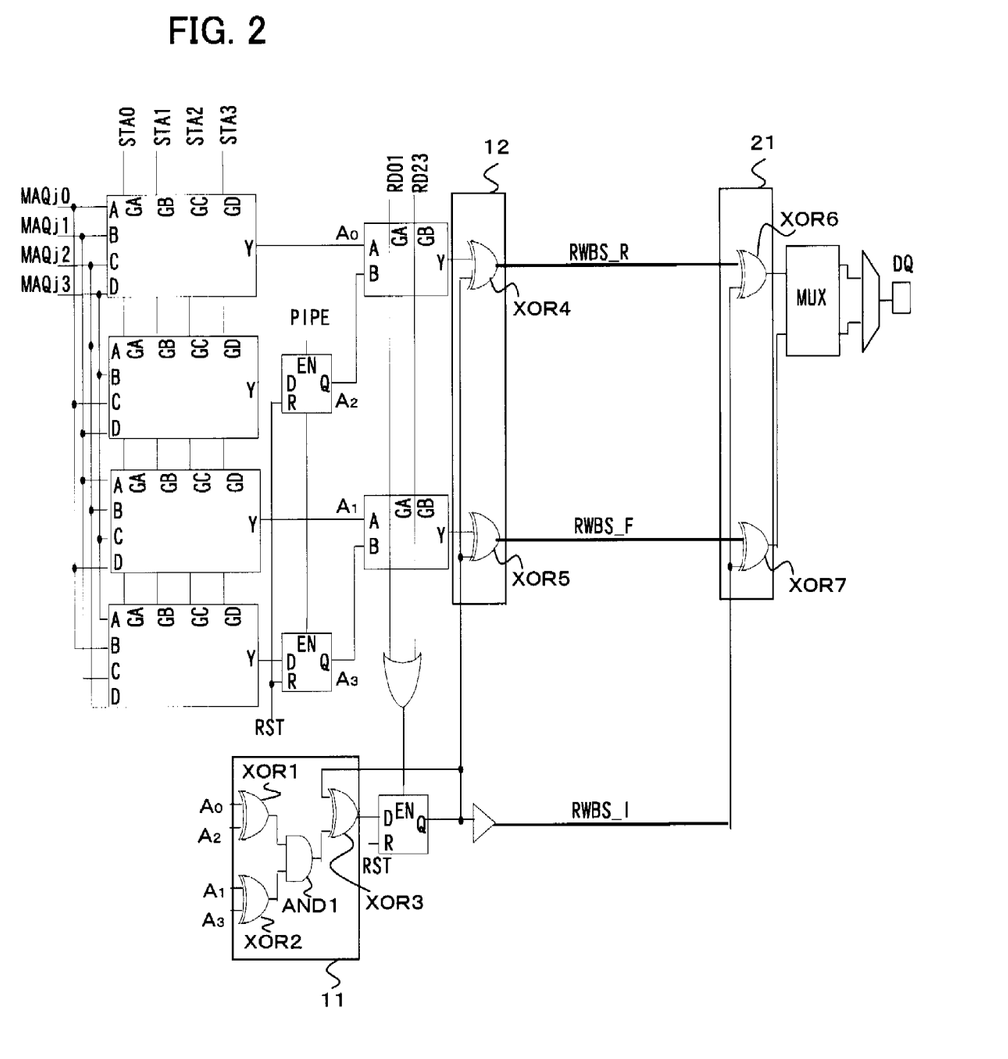
FIG. 2 is a detailed block diagram of a data transfer device according to a first exemplary embodiment of the present invention.

FIG. 2 is a detailed block diagram of the data transfer device according to a first exemplary embodiment of the present invention.

Figure 3A:
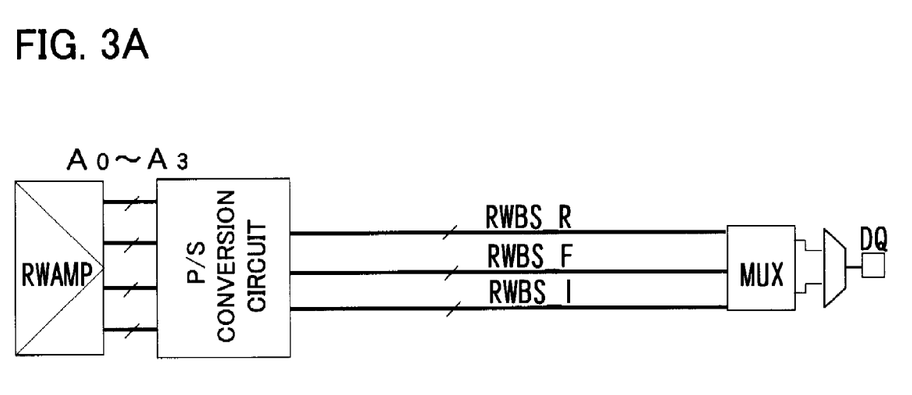
FIGS. 3A and 3B are respectively a block diagram of the data transfer device according to the first exemplary embodiment of the present invention and a polarity diagram of bus signals according to the first exemplary embodiment of the present invention.
Figure 3B:
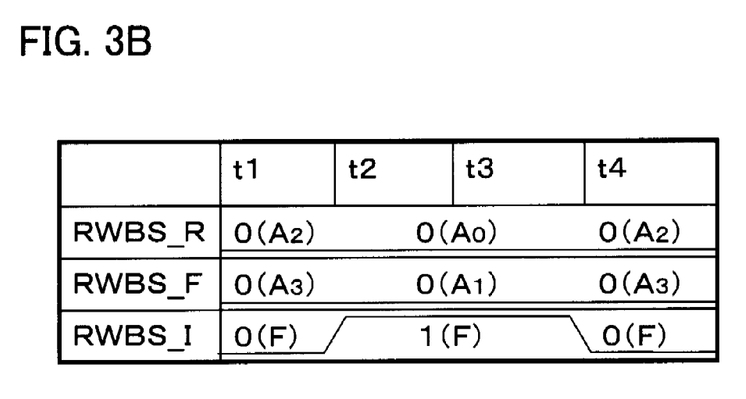

FIG. 3A is a block diagram of the data transfer device according to the first exemplary embodiment of the present invention, and FIG. 3B is a polarity diagram of bus signals.

Referring to FIG. 3A, in the data transfer device according to this exemplary embodiment, one flag line RWBS_I indicating whether or not a change has occurred in time-divided consecutive data is added to a conventional RWBS transfer method (in FIG. 7A) of performing the time division transfer using the 4:2 P/S conversion. Then, a 4:(2+1) conversion is performed.

Referring to FIG. 2, the data transfer device according to this exemplary embodiment includes the encoding circuit 12 and the decoding circuit 21 which are formed of XOR (exclusive OR) circuits before and after RWBS transfer.

Figure 4:
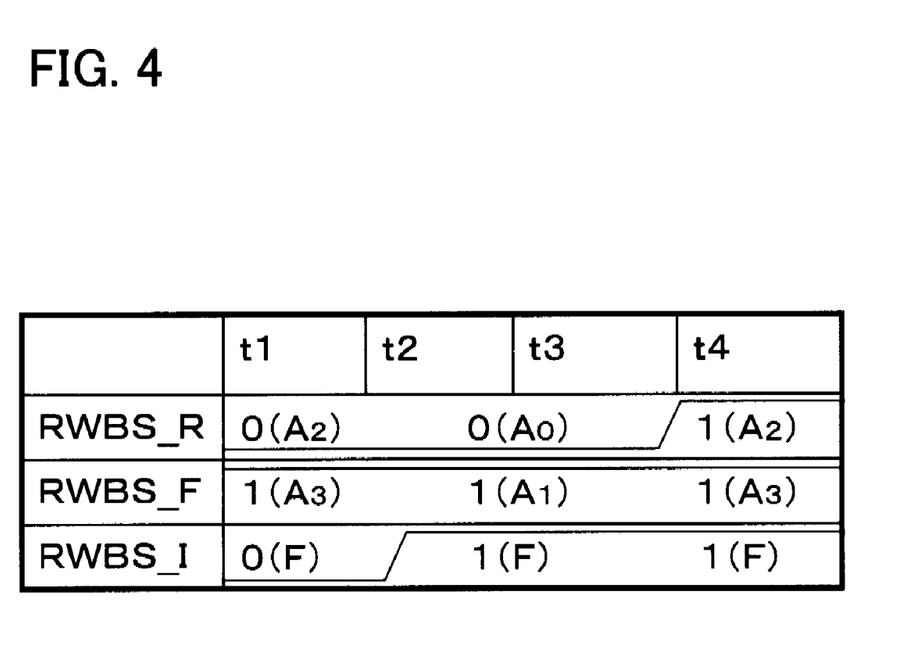
FIG. 4 is a polarity diagram of the bus signals in the data transfer device according to the first exemplary embodiment of the present invention.

FIGS. 3B and 4 are polarity diagrams, by way of example, of the bus signals of the data transfer device when the present invention has been applied to a DDR2 (based on a four-bit prefetch).

First, a READ operation per one DQ in the DDR2 will be explained.

In the conventional RWBS transfer system (in FIG. 7A), before RWBSs are driven, four parallel data $A_0$ to $A_3$ (for four-bit prefetching) are converted into two parallel data which are two time-divided, by a 4:2 P/S conversion circuit.

When the data are sequentially output in the order of $A_0$, $A_1$, $A_2$, and $A_3$, the data $A_0$ and the data $A_1$ are transferred through buses RWBS_R and RWBS_F, respectively. Next, the data $A_2$ and the data $A_3$ are transferred through the buses RWBS_R and RWBS_F, respectively.

Now let's consider a case where data (1100) are transferred after data (XX00) have been transferred, as a set of the data $A_0$ to $A_3$ ($A_0$, $A_1$, $A_2$, $A_3$), as shown in FIG. 7B. Herein, X indicates an arbitrary value.

In this case, through the buses RWBS_R and RWBS_F, the data are transmitted in the order of the data $A_2$ and $A_3$, the data $A_0$ and $A_1$, and the data $A_2$ and $A_3$, that is, in the order of the data (00), (11), and (00).

Then, the number of transients per one DQ is four, as shown in FIG. 7B.

In contrast to the conventional 4:2 P/S conversion circuit as described above, the flag generation circuit 11, encoding circuit 12, decoding circuit 21, and the bus RWBS_I that transfers the inversion flag are added, as shown in FIG. 2.

The encoding circuit 12 includes an XOR circuit XOR4 that receives the bit $A_0$ or $A_2$ and the inversion flag F, for output to the first bus RWBS_R, and an XOR circuit XOR5 that receives the bit $A_1$ or $A_3$ and the inversion flag F, for output to the second bus RWBS_F.

The decoding circuit 21 includes an XOR circuit XOR6 that receives the bit $A_0$ or $A_2$ and the inversion flag F and an XOR circuit XOR7 that receives the bit $A_1$ or $A_3$ and the inversion flag F.

The flag generation circuit 11 includes a first XOR circuit XOR1 that receives the bits $A_0$ and $A_2$, a second XOR circuit XOR2 that receives the bits $A_1$ and $A_3$, an AND circuit AND1 that receives outputs of the first and second XOR circuits, and a third XOR circuit XOR3 that receives an output of the AND circuit AND1 and the inversion flag F, for output to the third bus RWBS_I.

Now let's consider a case where the data (1100) is transferred after the data (XX00) has been transferred, as the set of the data $A_0$ to $A_3$ ($A_0$, $A_1$, $A_2$, $A_3$), as in the case described above.

In this case, as shown in FIG. 7B, to the flag generation circuit 11 in FIG. 2, the data (00) are input as the data $A_2$ and $A_3$, respectively, the data (11) are input as the data $A_0$ and $A_1$, respectively, and then the data (00) are input as the data $A_2$ and $A_3$, respectively.

Now, it is assumed that an initial value of the flag F is zero. In case where the data (00)→(11) are respectively input as the data $A_2$ $A_3$, $A_0$ $A_1$, and "0" is input as the flag F, the flag generation circuit 11 outputs "1", as the flag F. Next, in case where the data (11)→(00) are respectively input as the data $A_0$ $A_1$, $A_2$ and $A_3$, and "1" is input as the flag F, the flag generation circuit 11 outputs "0" as the flag F. In this case, the flag transitions in the order of "0" to "1", and to "0".

When XOR operations with the flag F are performed in the encoding circuit 12, the data $A_2\ A_3 \rightarrow A_0\ A_1 \rightarrow A_2 A_3$ are respectively sent out to the buses as data $(00) \rightarrow (00) \rightarrow (00)$ (as shown in FIG. 3B) i.e., $[0(A_2), 0(A_3)] \rightarrow [0(A_0), 0(A_1)] \rightarrow [0(A_2), 0(A_3)]$.

In this case, referring to FIG. 3B, the number of times of transients on the buses RWBS_R, RWBS_F, and RWBS_I can be limited to two per one four-bit prefetch operation (i.e., per two cycles of an RWBS transfer cycle).

Accordingly, compared with the conventional method (shown in FIG. 7B) where four transients have occurred per one four-bit prefetch operation, the number of times of transients can be reduced to a half being two.

Figure 8:
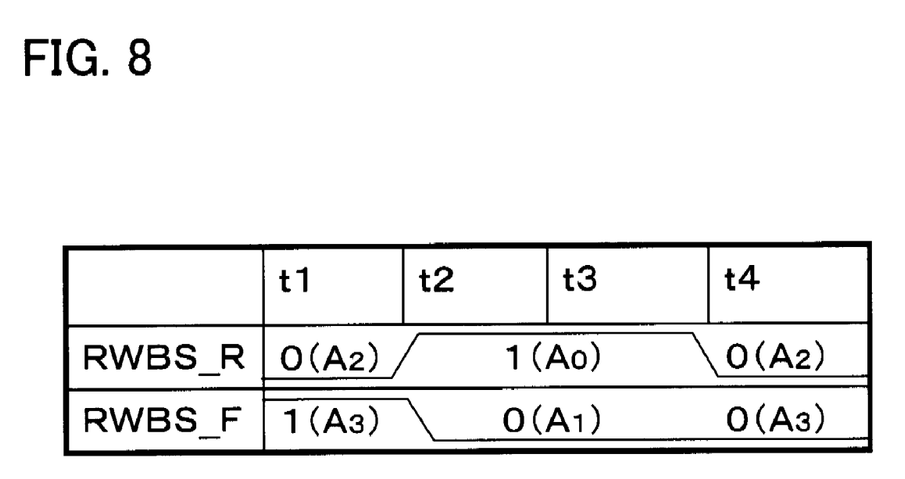
FIG. 8 is a polarity diagram of the bus signals in the conventional data transfer device.

Now, let's consider a case where data (1000) are transferred after data (XX01) have been transferred, as a set of the data $A_0$ to $A_3$ ($A_0, A_1, A_2$, and $A_3$), as shown in FIG. 8 as another example.

In this case, through the buses RWBS_R and RWBS_F, the data are transmitted in the order of the data $A_2\ A_3, \rightarrow A_0\ A_1, \rightarrow A_2 A_3$, that is, in the order of the data $(01) \rightarrow (10) \rightarrow (00)$.

When the conventional transfer method is used, the number of times of transients per one DQ is three, referring to FIG. 8.

Considering a case where the same data are transferred by the data transfer device according to the first exemplary embodiment of the present invention, the number of times of transients per one DQ can be reduced to two, referring to FIG. 4.

Further, in the data transfer device according to this exemplary embodiment, data comparisons (i.e., the XOR operation of the time-divided data $A_0$ and $A_2$ and the XOR operation of the time-divided data $A_1$ and $A_3$) are respectively made between the two time-divided data before transfer through the buses. Thereby a comparison with data to be transferred next can be pipeline processed simultaneously while data is being transferred through the bus. Accordingly, a higher-speed processing can also be achieved.

In a WRITE operation as well, S/P conversion of (2+1) serial data into four parallel data is just performed before and after RWBS driving. Thus, as at a time of the READ operation, an effect of reducing current can be obtained according to the method shown in this exemplary embodiment.

RWBS consumption current is indicated by:

$$I = C*V*F$$

∝ C*number of times of RWBS transients (Tr)/RWBS transfer cycle

∝ C*Tr where C indicates an RWBS wiring capacitance.

Accordingly, by reducing the maximum number of times of transients on the RWBSs during a unit cycle (which is the RWBS transfer cycle, tCCD), RWBS charging/discharging current can be reduced. The consumption current can be thereby reduced without impairing a high-speed operation.

In the data transfer device according to this exemplary embodiment, in order to reduce the RWBS charging/discharging current (the number of times of transients), 4:2+1 (per three data) conversion is performed for each transfer, without using a large-scale majority decision circuit.

In other words, the data transfer device according to this exemplary embodiment does not use the large-scale majority decision circuit. Accordingly, an increase in the area of the device, an increase in the consumption circuit, a speed reduction (a transfer delay) due to waiting for a comparison and determination result, caused by the majority decision circuit itself, can be avoided.

Further, a data comparison is made between two time-divided data before transfer to the bus in order to achieve a higher-speed operation. Pipeline processing where a comparison with next transfer data is simultaneously made during transfer of certain data through the bus is also thereby enabled.

Second Exemplary Embodiment

In an 8-bit prefetch DDR3 as well, by using a multi-stage RWBS transfer method in which 4:2+1 time division transfer in the first exemplary embodiment is performed in each stage, the RWBS charging/discharging current can be reduced, based on a simple circuit configuration.

Figure 9A:
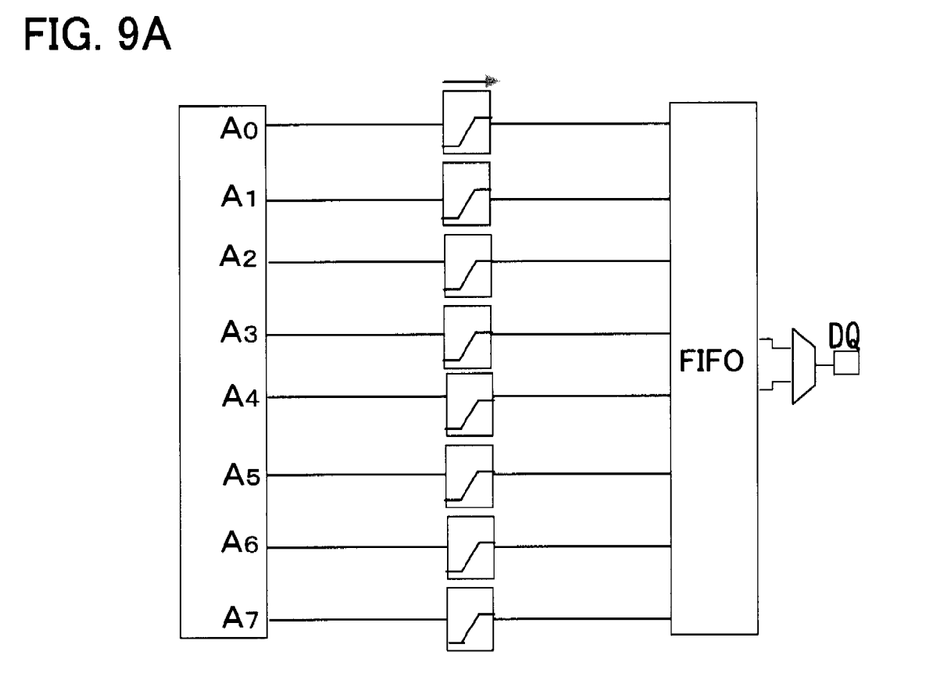
FIGS. 9A and 9B are respectively a block diagram of a conventional data transfer device (that uses an 8-bit parallel transfer method) and a block diagram of a conventional data transfer device (based on a time division transfer method using an 8:4 P/S conversion).

FIG. 9A is a block diagram of a conventional data transfer device (that uses an 8-bit parallel transfer method).

When data (11111111) are transferred after data (00000000) have been transferred, as a set of data $A_0$ to $A_7$ ($A_0, A_1, A_2, A_3, A_4, A_5, A_6, A_7$) in the conventional 8-bit parallel data transfer device, the number of times of transients becomes a maximum of eight.

Figure 9B:
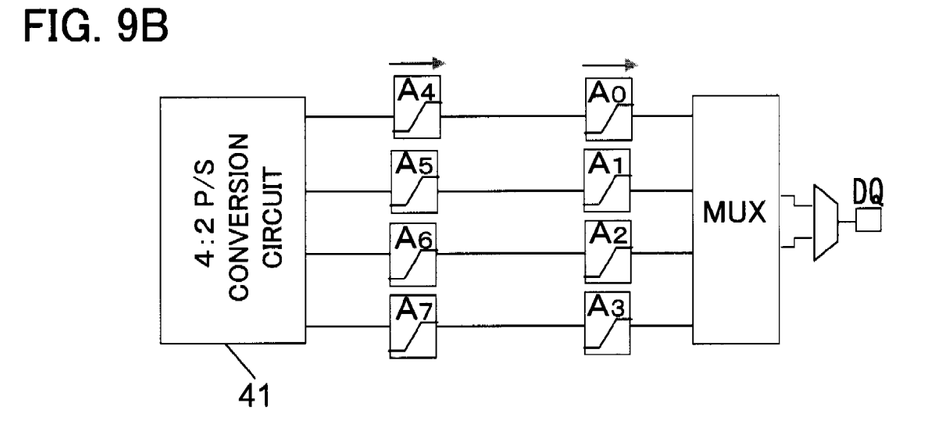

FIG. 9B is a block diagram of a conventional data transfer device (based on a time division transfer method using an 8:4 P/S conversion). Referring to FIG. 9B, the conventional data transfer device comprises 4:2 P/S conversion circuit 41.

When (11110000) are transferred after (XXXX0000) have been transferred, as a set of the data $A_0$ to $A_7$ ($A_0, A_1, A_2, A_3, A_4, A_5, A_6, A_7$), in the conventional data transfer device based on the time division transfer method using an 8:4 P/S conversion circuit, the number of times of transients becomes a maximum of eight.

Figure 5:
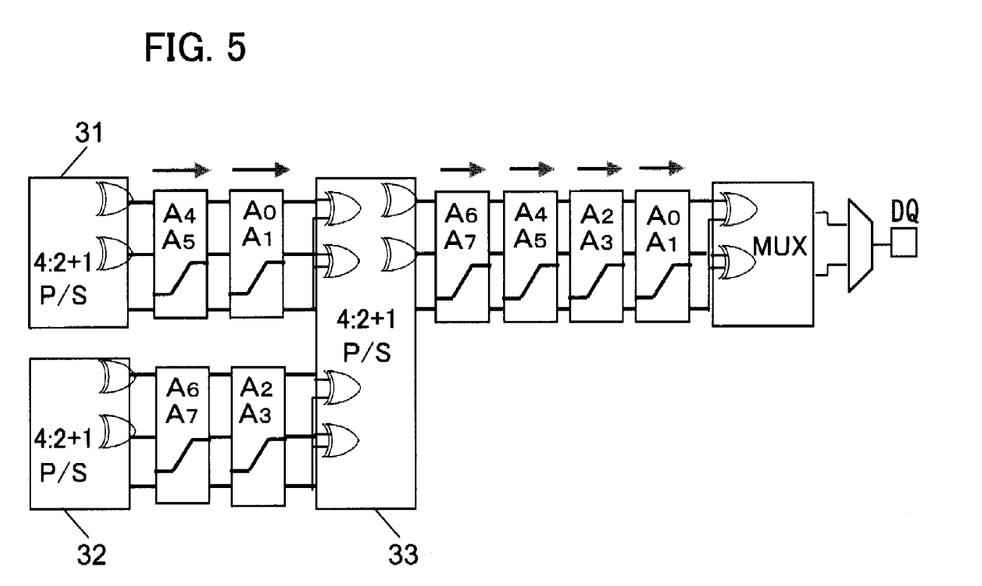
FIG. 5 is a block diagram of a data transfer device according to a second exemplary embodiment of the present invention.

In contrast, FIG. 5 is a block diagram of a data transfer device according to a second exemplary embodiment of the present invention. Referring to FIG. 5, the data transfer device of the present exemplary embodiment comprises 4:2+1 P/S conversion circuits 31-33.

The data transfer device according to the second exemplary embodiment corresponds to a case where the present invention has been applied to a DDR3.

In an 8-bit prefetch operation (per four cycles of the RWBS transfer cycle), transfer using the 4:2+1 time division conversion in the first exemplary embodiment is performed by multiple stages based on 4:2+1 P/S conversion circuits 31-33, and RWBSs are divided for operation (in this exemplary embodiment, the RWBSs being divided into halves in the first stage followed by combining in a subsequent (second) stage at the conversion circuit 33).

The data transfer device according to this exemplary embodiment can be so configured that an increase in the area of the device is prevented and the device has a high packaging density.

In the case of the DDR3 as well, the RWBS charging and discharging current can be reduced, as in the DDR2 in the first exemplary embodiment.

The present invention can be applied to RWBS transfer in the DDR2 SDRAM and the DDR3 SDRAM.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A data transfer device that sequentially transfers bit sequences in parallel from a transmit unit to a receive unit through a plurality of buses, wherein said transmit unit comprises:
a flag generation circuit which generates a flag indicating whether or not bit inversion has occurred in consecutive even bits and consecutive odd bits in each of the bit sequences which separate even and odd bits to be transferred through said buses, and transmits the generated flag to said receive unit; and
an encoding circuit that encodes the bit sequences based on the flag, for transmission to said receive unit; and
said receive unit comprises:
a decoding circuit that decodes the bit sequences based on the bit sequences and the flag.

2. The data transfer device according to claim 1, wherein the data transfer device is a data transfer device which sequentially transfers the bit sequences in parallel from said transmit unit to said receive unit through two buses, based on a 4:2 parallel-to-serial conversion.

3. The data transfer device according to claim 2, wherein said flag generation circuit is so configured as to generate a valid flag, only when the bit inversion has occurred in the consecutive bits of the bit sequences to be transferred through said two buses, respectively, and to transmit the valid flag to said receive unit;
said encoding circuit is so configured as to invert the bit sequences only when the flag is valid and to transmit the inverted bit sequences to said receive unit; and
said decoding circuit is so configured as to invert the bit sequences only when the flag is valid.

4. The data transfer device according to claim 3, wherein said flag generation circuit is so configured as to generate a valid flag:
in case where a flag generated by said flag generation circuit followed by transmission to said receive unit is received, or a flag generated by said flag generation circuit is stored, and consecutive bits to be transferred through said two buses, respectively, are both inverted and the flag is not valid; or
in case where the bit inversion does not occur in at least one of the consecutive bits to be transferred through said two buses, respectively, and the flag is valid; and
to transmit the generated valid flag to said receive unit.

5. A multi-stage data transfer device comprising:
the data transfer device according to claim 1, as first, second, and third data transfer devices;
said multi-stage data transfer device being so configured to supply outputs of said first and second data transfer devices to said third data transfer device.

6. A semiconductor memory device comprising:
the data transfer device according to claim 1.

7. A data transfer device configured to repeat a step of transmitting a first bit through a first bus, a second bit through a second bus, a third bit through said first bus, and a fourth bit through said second bus, from a transmit unit to a receive unit, wherein said data transfer device further comprises:
a third bus configured to transfer an inversion flag;
said transmit unit further comprises:
a flag generation circuit; and
an encoding circuit;
said receive unit further comprises:
a decoding circuit;
said flag generation circuit receives the first through fourth bits and the inversion flag, and is so configured as to output to said third bus the inversion flag as a valid flag (i) when bit inversion between the first and third bits and bit inversion between the second and fourth bits occur and the inversion flag is not valid, or (ii) when at least one of the bit inversion between the first and third bits and the bit inversion between the second and fourth bits does not occur and the inversion flag is valid; and otherwise to output to said third bus the inversion flag as an invalid flag;
said encoding circuit receives the first through fourth bits and the inversion flag, and is so configured as to invert the first through fourth bits when the inversion flag is valid, and otherwise to output the first through fourth bits to said first and second bus without alteration; and
said decoding circuit receives the first through fourth bits and the inversion flag, and is so configured as to invert the first through fourth bits when the inversion flag is valid, and otherwise to output the first through fourth bits without alteration.

8. A data transfer device that sequentially transfers bit sequences in parallel from a transmit unit to a receive unit through a plurality of buses,
wherein said transmit unit comprises:
a flag generation circuit which generates a flag indicating whether or not bit inversion has occurred in consecutive bits in each of the bit sequences to be transferred through said buses, and transmits the generated flag to said receive unit; and
an encoding circuit that encodes the bit sequences based on the flag, for transmission to said receive unit; and
said receive unit comprises:
a decoding circuit that decodes the bit sequences based on the bit sequences and the flag,
wherein said encoding circuit comprises:
an XOR circuit that receives the first bit or the third bit and the inversion flag, for output to said first bus; and
an XOR circuit that receives the second bit or the fourth bit and the inversion flag, for output to said second bus.

9. A data transfer device that sequentially transfers bit sequences in parallel from a transmit unit to a receive unit through a plurality of buses,
wherein said transmit unit comprises:
a flag generation circuit which generates a flag indicating whether or not bit inversion has occurred in consecutive bits in each of the bit sequences to be transferred through said buses, and transmits the generated flag to said receive unit; and
an encoding circuit that encodes the bit sequences based on the flag, for transmission to said receive unit; and
said receive unit comprises:
a decoding circuit that decodes the bit sequences based on the bit sequences and the flag,
wherein said decoding circuit comprises:
an XOR circuit that receives the first bit or the third bit and the inversion flag; and
an XOR circuit that receives the second bit or the fourth bit and the inversion flag.

10. A data transfer device that sequentially transfers bit sequences in parallel from a transmit unit to a receive unit through a plurality of buses,
wherein said transmit unit comprises:
a flag generation circuit which generates a flag indicating whether or not bit inversion has occurred in consecutive bits in each of the bit sequences to be transferred through said buses, and transmits the generated flag to said receive unit; and
an encoding circuit that encodes the bit sequences based on the flag, for transmission to said receive unit; and said receive unit comprises:
a decoding circuit that decodes the bit sequences based on the bit sequences and the flag,
wherein said flag generation circuit comprises:
a first XOR circuit that receives the first bit and the third bit;
a second XOR circuit that receives the second bit and the fourth bit;
an AND circuit that receives outputs of said first and second XOR circuits; and
a third XOR circuit that receives an output of said AND circuit and the inversion flag, for output to said third bus.

11. A data transfer method of sequentially transferring bit sequences in parallel from a transmit unit to a receive unit through a plurality of buses, wherein said method comprises:
generating a flag indicating whether bit inversion has occurred in consecutive even bits and consecutive odd bits in each of the bit sequences which separate even and odd bits to be transferred through said buses, and transmitting the generated flag to said receive unit;
encoding the bit sequences based on the flag, for transmission to said receive unit; and
decoding the bit sequences based on the bit sequences and the flag.

12. The data transfer method according to claim 11, wherein the data transfer method is a data transfer method of sequentially transferring the bit sequences in parallel from said transmit unit to said receive unit through two buses, based on a 4:2 parallel-to-serial conversion.

13. The data transfer method according to claim 12, wherein
in said generating, the flag being valid is generated only when the bit inversion has occurred in the consecutive bits of said each of the bit sequences to be transferred through said different buses, respectively, and the valid flag is transmitted to said receive unit;
in said encoding, the bit sequences are inverted only when the flag is valid and the inverted bit sequences are transmitted to said receive unit; and
in said decoding, the bit sequences are inverted only when the flag is valid.

14. The data transfer method according to claim 13, wherein in said flag generating, a valid flag is generated and transmitted to said receive unit only:
in case where the flag generated in said flag generating followed by transmission to said receive unit is received or a flag generated in said flag generating is stored, and consecutive bits to be transferred through said two buses, respectively, are both inverted and the flag is not valid; or
in case where the bit inversion does not occur in at least one of the consecutive bits to be transferred through said two buses, respectively, and the flag is valid.

* * * * *